United States Patent
Parida et al.

(10) Patent No.: US 7,479,905 B2
(45) Date of Patent: Jan. 20, 2009

(54) APPARATUS, SYSTEM AND METHOD FOR DATA COMPRESSION USING IRREDUNDANT PATTERNS

(75) Inventors: Laxmi Priya Parida, Mohegan Lake, NY (US); Alberto Apostolico, West Lafayette, IN (US)

(73) Assignee: International Business Machines Corporation, Armonk, NY (US)

( * ) Notice: Subject to any disclaimer, the term of this patent is extended or adjusted under 35 U.S.C. 154(b) by 583 days.

(21) Appl. No.: 10/627,871

(22) Filed: Jul. 28, 2003

(65) Prior Publication Data

US 2005/0025232 A1 Feb. 3, 2005

(51) Int. Cl.
*H03M 7/00* (2006.01)
(52) U.S. Cl. .............................. 341/60; 341/51; 341/67
(58) Field of Classification Search .................. 341/51, 341/60, 67, 82
See application file for complete search history.

(56) References Cited

U.S. PATENT DOCUMENTS

| | | | | |
|---|---|---|---|---|
| 3,656,178 | A * | 4/1972 | De Maine et al. | 341/87 |
| 5,703,907 | A * | 12/1997 | James | 375/240 |
| 5,845,238 | A * | 12/1998 | Fredenburg | 704/1 |
| 6,416,410 | B1 * | 7/2002 | Abou-Samra et al. | 463/31 |
| 6,420,980 | B1 * | 7/2002 | Ejima | 341/65 |
| 7,280,057 | B2 * | 10/2007 | Delfs et al. | 341/87 |
| 2003/0090702 | A1 * | 5/2003 | Trelewicz | 358/1.15 |
| 2003/0090740 | A1 * | 5/2003 | Trelewicz | 358/426.13 |
| 2006/0059187 | A1 * | 3/2006 | Brown | 707/102 |
| 2006/0139187 | A1 * | 6/2006 | Helfman et al. | 341/51 |

* cited by examiner

*Primary Examiner*—Linh V Nguyen
(74) *Attorney, Agent, or Firm*—Vazken Alexanian; McGinn IP Law Group, PLLC

(57) ABSTRACT

An apparatus for data compression includes an identifier which identifies a plurality of irredundant patterns in a data set, and an extractor which extracts at least a portion of the plurality of irredundant patterns from the data set to generate a compressed data set.

17 Claims, 12 Drawing Sheets

|   | 1 | 2 | 3 | 4 | 5 |
|---|---|---|---|---|---|
| $m_1$ | a | b | c | . | d |
| $m_2$ | a | b | e |   |   |
| $m_3$ | a | d | d | . | d |
| $m_4$ | a | d | . | . | e |
| $m_5$ | a | b | a | . | d |

THREADING MOTIFS AND THEIR OCCURRENCES

LOSSY COMPRESSION OF GRAY-SCALE IMAGES (1 PIXEL = 1 BYTE)

| FILE | FILE LEN | GZIP LEN [%COMPR] | CODEC$_2$ [%COMPR] | CODEC$_1$ [%COMPR] | %DIFF GZIP | %LOSS | ',' CHAR |
|---|---|---|---|---|---|---|---|
| BRIDGE | 66336 | 61657[7.05] | 60987[8.06] | 57655[13.08] | 6.49 | 0.42 | 1/4 |
|  |  |  | 60987[8.06] | 50656[23.63] | 17.84 | 14.29 | 1/3 |
| CAMERA | 66336 | 48750[26.51] | 47842[27.88] | 46192[30.36] | 5.25 | 0.74 | 1/6 |
|  |  |  | 48044[27.57] | 45882[30.83] | 5.88 | 2.17 | 1/5 |
|  |  |  | 47316[28.67] | 43096[35.03] | 11.60 | 9.09 | 1/4 |
| LENA | 292944 | 234543[12.10] | 226844[13.73] | 210786[19.83] | 10.13 | 4.17 | 1/4 |
|  |  |  | 186359[29.13] | 175126[33.39] | 25.33 | 20.00 | 1/3 |
| PEPPERS | 262944 | 232334[11.64] | 218175[17.03] | 199605[23.85] | 14.09 | 6.25 | 1/4 |
|  |  |  | 180783[31.25] | 173561[33.99] | 25.30 | 20.00 | 1/3 |

FIG.5

LOSSY COMPRESSION OF BINARY IMAGES

| FILE | FILE LEN | GZIP LEN [%COMPR] | CODEC$_2$ [%COMPR] | CODEC$_1$ [%COMPR] | %DIFF GZIP | %LOSS | ',' CHAR |
|---|---|---|---|---|---|---|---|
| CCITT7 | 513229 | 109612[78.64] | 98076[80.89] | 91399[82.19] | 16.62 | 16.67 | 1/5 |
|  |  |  | 93055[81.87] | 90873[82.29] | 17.10 | 16.67 | 1/4 |
|  |  |  | 92658[81.95] | 85391[83.36] | 22.10 | 25.00 | 1/3 |
| TEST4 | 279213 | 58736[78.96] | 57995[79.23] | 54651[80.42] | 6.95 | 0.91 | 1/4 |
|  |  |  | 57714[79.32] | 54402[80.51] | 7.38 | 1.27 | 1/3 |

FIG.6

LOSSY COMPRESSION OF MUSIC (1 SAMPLE = 1 BYTE)

| FILE | FILE LEN | GZIP LEN [%COMPR] | CODEC$_2$ [%COMPR] | CODEC$_1$ [%COMPR] | %DIFF GZIP | %LOSS | ',' CHAR |
|---|---|---|---|---|---|---|---|
| CROWD | 128900 | 103834[19.44] | 92283[28.41] | 86340[33.01] | 16.85 | 16.67 | 1/3 |
| ECLIPSE | 196834 | 171846[12.96] | 148880[24.36] | 139308[29.22] | 18.93 | 9.09 | 1/4 |
|  |  |  | 114709[41.72] | 111058[43.57] | 35.37 | 25.00 | 1/3 |

FIG.7

LOSSY VS. LOSSLESS PERFORMANCE

| FILE | FILE LEN | GZIP [%COMPR] | CODEC₁ [%COMPR] | %LOSS | '/ CHAR | LOSSLESS [%COMPR] | %DIFF GZIP |
|---|---|---|---|---|---|---|---|
| BRIDGE | 66336 | 61657[7.05] | 50656[23.63] | 14.29 | 1/3 | 59344[10.54] | 3.75 |
| CAMERA | 66336 | 48750[26.51] | 43096[35.03] | 9.09 | 1/4 | 45756[31.02] | 6.14 |
| LENA | 262944 | 234543[12.10] | 175126[33.39] | 20.00 | 1/3 | 199635[24.07] | 14.88 |
| PEPPERS | 262944 | 232334[11.64] | 199605[23.85] | 6.25 | 1/4 | 211497[19.56] | 8.97 |
| | | | 173561[33.99] | 20.00 | 1/3 | 195744[25.55] | 15.75 |
| CCITT7 | 513229 | 109612[78.64] | 90873[82.29] | 16.67 | 1/4 | 97757[80.09] | 10.82 |
| | | | 85391[83.36] | 25.00 | 1/3 | 89305[82.59] | 18.53 |
| TEST4 | 279213 | 58736[78.96] | 54402[80.51] | 1.27 | 1/3 | 54875[80.34] | 6.57 |
| CROWD | 128900 | 103834[19.44] | 86340[33.01] | 16.67 | 1/3 | 96903[24.82] | 6.68 |
| ECLIPSE | 196834 | 171846[12.96] | 139308[29.22] | 9.09 | 1/4 | 159206[19.11] | 7.36 |
| | | | 111058[43.57] | 25.00 | 1/3 | 151584[22.98] | 11.97 |

FIG.8

LOSSLESS COMPRESSION OF CALGARY CORPUS

| FILE | FILE LEN | GZIP [%COMPR] | CODEC$_1$ [%COMPR] | %LOSS | '/' CHAR | LOSSLESS [%COMPR] | %DIFF GZIP |
|---|---|---|---|---|---|---|---|
| BIB | 111261 | 35063[68.49] | 36325[67.35] | 3.70 | 1/3 | 37491[66.30] | 6.92 |
| BOOK1 | 768771 | 313376[60.01] | 245856[68.01] | 12.50 | 1/3 | 277180[63.95] | 11.55 |
| BOOK2 | 610856 | 206687[66.16] | 197199[67.72] | 4.35 | 1/4 | 202713[66.81] | 1.92 |
| GEO | 102400 | 68493[33.11] | 40027[60.91] | 16.67 | 1/4 | 63662[37.83] | 7.05 |
| NEWS | 377109 | 144840[61.59] | 144541[61.67] | 0.42 | 1/3 | 144644[61.64] | 0.14 |
| OBJ1 | 21504 | 10323[51.99] | 8386[61.00] | 16.67 | 2/5 | 9221[57.12] | 10.68 |
| OBJ2 | 246814 | 81631[66.93] | 71123[71.18] | 20.00 | 1/2 | 83035[66.36] | -1.72 |
| PAPER1 | 53161 | 18577[65.06] | 19924[62.52] | 1.75 | 1/3 | 20174[62.05] | -8.60 |
| PAPER2 | 82199 | 29753[63.80] | 29920[63.60] | 0.76 | 1/2 | 30219[63.24] | -1.57 |
| PIC | 513216 | 56422[89.01] | 52229[89.82] | 0.56 | 1/3 | 52401[89.79] | 7.13 |
| PROGC | 39611 | 13275[66.49] | 13840[65.06] | 1.32 | 1/2 | 14140[64.30] | -6.52 |
| PROGL | 71646 | 16273[77.29] | 17249[75.92] | 0.58 | 1/3 | 17355[75.78] | -6.65 |
| PROGP | 49379 | 11246[77.23] | 12285[75.12] | 0.64 | 1/3 | 12427[74.83] | -10.50 |

FIG.9

LOSSLESS COMPRESSION OF SEQUENCES FROM DNA YEAST FAMILIES

| FILE | FILE LEN | GZIP [%COMPR] | CODEC$_1$ [%COMPR] | %LOSS | ';'/ CHAR | LOSSLESS [%COMPR] | %DIFF GZIP |
|---|---|---|---|---|---|---|---|
| SPOR EARLYII | 25008 | 8008[67.98] | 6990[72.05] | 0.45 | 1/3 | 7052[71.80] | 11.94 |
| SPOR EARLYI | 31039 | 9862[68.23] | 8845[71.50] | 0.36 | 1/3 | 8914[71.28] | 9.61 |
| HELDEN CGN | 32871 | 10379[68.43] | 8582[73.89] | 1.33 | 1/3 | 8828[73.14] | 14.94 |
| SPOR MIDDLE | 54325 | 16395[69.82] | 14839[72.68] | 0.36 | 1/4 | 14924[72.53] | 8.97 |
| HELDEN ALL | 112507 | 33829[69.93] | 29471[73.81] | 1.56 | 1/4 | 29862[73.46] | 11.73 |
| SPOR ALL | 222453 | 68136[69.37] | 56323[74.68] | 1.61 | 1/3 | 57155[74.31] | 16.12 |
| ALL UP 400K | 399615 | 115023[71.22] | 93336[76.64] | 14.29 | 1/3 | 106909[73.25] | 7.05 |

FIG.10

SYNOPSIS OF COMPRESSION RATES FOR SEQUENCES IN THE YEAST DNA BY VARIOUS LOSSLESS METHODS. THE FIGURE IN PARENTHESIS IS THE PERCENTAGE GAIN OF CODEC$_1$ VERSUS OTHER METHODS

| FILE | FILE LEN | HUFFMAN PACK [%DIFF] | LZ-78 COMPRESS [%DIFF] | LZ-77 GZIP [%DIFF] | BWT GZIP [%DIFF] | CODEC$_1$ LOSSLESS |
|---|---|---|---|---|---|---|
| SPOR EARLYII | 25008 | 7996[13.4] | 7875[11.7] | 8008[13.6] | 7300[3.5] | 7052 |
| SPOR EARLYI | 31039 | 9937[11.5] | 9646[8.2] | 9862[10.6] | 9045[1.5] | 8914 |
| HELDEN CGN | 32871 | 10590[20.0] | 10223[15.8] | 10379[17.6] | 9530[8.0] | 8828 |
| SPOR MIDDLE | 54325 | 17295[15.9] | 16395[9.9] | 16395[9.9] | 15490[3.8] | 14924 |
| HELDEN ALL | 112507 | 36172[21.1] | 33440[12.0] | 33829[13.3] | 31793[6.5] | 29862 |
| SPOR ALL | 222453 | 70755[23.8] | 63939[11.9] | 68136[19.2] | 61674[7.9] | 57155 |
| ALL UP 400K | 399615 | 121700[13.8] | 115029[7.6] | 115023[7.6] | 112363[5.1] | 106909 |

FIG.11

COMPRESSION, FIDELITY AND LOSS IN RECONSTRUCTION OF GREY SCALE IMAGES

| FILE | FILE LEN | GZIP LEN [%COMPR] | CODEC$_1$ [%COMPR] | DIFF % GZIP | %LOSS | '·'/ CHAR | %LOSS PER PIXEL OVER RECON PIX | %LOSS PER PIXEL OVER ALL PIX |
|---|---|---|---|---|---|---|---|---|
| BRIDGE | 66336 | 61657[7.05] | 57655[13.08] | 6.49 | 0.42 | 1/4 | 5.67 | 0.02 |
| CAMERA | 66336 | 48750[26.51] | 60987[8.06] | 17.84 | 14.29 | 1/3 | 7.69 | 0.90 |
|  |  |  | 47316[28.67] | 11.60 | 9.09 | 1/4 | 0.78 | 0.05 |
| LENA | 262944 | 234543[12.10] | 210786[19.83] | 10.13 | 4.17 | 1/4 | 7.26 | 0.27 |
|  |  |  | 186359[29.13] | 25.33 | 20.00 | 1/3 | 5.11 | 0.81 |
| PEPPERS | 262944 | 232334[11.64] | 199605[23.85] | 14.09 | 6.25 | 1/4 | 1.53 | 0.08 |
|  |  |  | 180783[31.25] | 25.30 | 20.00 | 1/3 | 3.29 | 0.52 |

FIG.12

DESCRIPTION OF FARMER OAK – AN INCIDENT  When Farmer Oak smile., the corners .f his mouth spread till the. were within an unimportant distance .f his ears, his eye. were reduced to chinks, and ...erging wrinklered round them, extending upon ... countenance li.e the rays in a rudimentary sketch of the rising sun. His Christian name was Gabriel, and on working days he was a young man of sound judgment, easy motions, proper dress, and ...eral good character. On Sundays, he was a man of misty views rather given to postponing, and .ampered by his best clotes and umbrella : upon ... whole, one who felt himself to occupy morally that ... middle space of Laodicean neutrality which ... between the Communion people of the parish and the drunken section, - that ... he went to church, but yawned privately by the t.ime the cong.egation reached the Nicene creed,- and thought of what there would be for dinner when he meant to be listening to the sermon.

DESCRIPTION OF FARMER OAK – AN INCIDENT  When Farmer Oak smiled, the corners of his mouth spread till they were within an unimportant distance of his ears, his eyes were reduced to chinks, and diverging wrinkles round them, extending upon his countenance like the rays in a rudimentary sketch of the rising sun. His Christian name was Gabriel, and on working days he was a young man of sound judgment, each motions, proper dress, and general good character. On Sundays, he was a man of misty views, rather given to postponing, and hampered by his best clothes and umbrella : upon the whole, one who felt himself to occupy morally that vast middle space of Laodicean neutrality which lay between the Communion people of the parish and the drunken section, - that is, he went to church, but yawned privately by the time the congregation reached the Nicene creed,- and thought of what there would be for dinner when he meant to be listening to the sermon.

FIG.17

APPARATUS, SYSTEM AND METHOD FOR DATA COMPRESSION USING IRREDUNDANT PATTERNS

BACKGROUND OF THE INVENTION

1. Field of the Invention

The present invention relates to an apparatus, system and method for data compression and, in particular, an apparatus, system and method for data compression which use irredundant patterns.

2. Description of the Related Art

Data compression methods are partitioned traditionally into lossy and lossless. Typically, lossy compression is applied to images and more in general, to signals susceptible to some degeneracy without lethal consequence. On the other hand, lossless compression is used in situations where fidelity is of the essence, which applies to high quality documents and perhaps most notably to text files.

Lossy methods rest mostly on transform techniques whereby, for instance, cuts are applied in the frequency, rather than in the time domain of a signal. By contrast, lossless textual substitution methods are applied to the input in native form, and exploit its redundancy in terms of more or less repetitive segments or patterns.

When textual substitution is applied to digital documents such as fax, image or audio signal data, one could afford some loss of information in exchange for savings in time or space. In fact, even natural language can easily sustain some degrees of indeterminacy where it is left for the reader to fill in the gaps.

For example, FIG. 10 illustrates two versions of the opening passage from the Book 1 of the Calgary Corpus. These versions are equally understandable by an average reader and yet when applied to the entire book the first variant requires 163,837 less bytes than the second one, out of 764,772.

In practice, the development of optimal lossless textual substitution methods is made hard by the circumstance that the majority of the schemes are NP-hard. Obviously, this situation cannot improve with lossy ones. As an approximation, heuristic off-line methods of textual substitution can be based on greedy iterative selection.

For example, at each iteration, a substring w of the text x is identified such that encoding all instances of w in x yields the highest possible contraction of x. This process is repeated on the contracted textstring, until substrings capable of producing contractions can no longer be found. This may be regarded as inferring a "straight line" grammar by repeatedly finding the production or rule that, upon replacing each occurrence of the "definition" by the corresponding "nonterminal", maximizes the reduction in size of the current textstring representation.

Recent implementations of such greedy off-line strategies compare favorably with other current methods, particularly as applied to ensembles of otherwise hardly compressible inputs such as biosequences. They also appear to be the most promising in terms of the achievable approximation to optimum descriptor sizes.

Off-line methods can be particularly advantageous in applications such as mass production of CD-ROMs, backup archiving, and any other scenario where extra time or parallel implementation may warrant the additional effort imposed by the encoding.

The idea of trading some amount of errors in reconstruction in exchange for increased compression is ingrained in Rate Distortion Theory, and has been recently revived in a number of papers, mostly dealing with the design and analysis of lossy extensions of Lempel-Ziv on-line schemata.

SUMMARY OF THE INVENTION

In view of the foregoing and other problems, disadvantages, and drawbacks of the aforementioned assemblies and methods, it is a purpose of the present invention to provide a apparatus, system and method for data compression.

In an exemplary aspect of the present invention, an apparatus for data compression includes an identifier which identifies a plurality of irredundant patterns in a data set (e.g., character string, character array, etc.), and an extractor which extracts at least a portion of the plurality of irredundant patterns from the data set to generate a compressed data set.

For purposes of the present invention, an irredundant pattern in a data set may be considered as a maximal motif (e.g., maximal in composition and length), the maximal motif and a location list of occurrences for the maximal motif being incapable of being deduced by a union of a number of location lists of other maximal motifs in a data set.

The apparatus may also include an ordering device which orders the plurality of irredundant patterns according to a frequency of occurrence in the data set. Further, the apparatus may include an input for inputting the data set, and an output for outputting the compressed data set. Further, the input may input parameters for the irredundant pattern discovery algorithm, the parameters including a string length for the data set, a minimum number of times the irredundant pattern must appear in the data set to be extracted, and a maximum number of consecutive don't care characters allowed in the irredundant pattern.

A more frequently occurring irredundant pattern is extracted before a less frequently occurring irredundant pattern. In addition, the plurality of irredundant patterns extracted from the data set may include irredundant patterns having a minumum frequency of occurrence.

Specifically, the inventive apparatus may identify the plurality of irredundant patterns according to an irredundant pattern discovery algorithm. For example, the irredundant pattern discovery algorithm may include initializing a set of irredundant patterns in the data set, constructing the set of irredundant patterns for each solid character, constructing location lists for the set of irredundant patterns, the set of irredundant patterns being iteratively adjusted based on the location lists until no further changes occur to the set of irredundant patterns, and updating the set of irredundant patterns.

The irredundant pattern discovery algorithm may further include computing one-character patterns, successively growing the one-character patterns by concatentating the one-character patterns with other patterns, trimming a number of growing patterns, and using a linearity of 2-motifs to bound a number of the growing patterns.

For example, the apparatus may be included a part of a facsimile machine or personal computer or network server. Further, the data set may include, for example, image data, text data, music data, genetic (e.g., DNA) sequences, etc.

In another exemplary aspect of the present invention, a system for data compression includes an identifying device which identifies a plurality of irredundant patterns in a data set, and an extracting device which extracts at least a portion of the plurality of irredundant patterns from the data set to generate a compressed data set. The system may further include an input device for inputting the data set, a memory device for storing the data set, a display device, an output device for outputting the compressed data set. Further, the identifying device may identify the plurality of irredundant patterns according to an irredundant pattern discovery algorithm (e.g., as described above).

In another aspect of the present invention, a data compression/decompression system includes a data compression apparatus (e.g., as described above), and a data decompression apparatus including an identifier which identifies the irredundant patterns extracted from the data set in the data compression apparatus, and an inserter for inserting the extracted irredundant patterns from the data set, into the compressed data set, to reproduce the data set.

For example, a data set may be compressed in one computer (e.g., network server) of a network, transmitted as compressed data along the network, and decompressed in another computer (e.g., network server) of the network. Similarly, the data set may be compressed in one facsimile machine, transmitted as compressed data, and decompressed by a receiving facsimile machine.

In another aspect of the present invention, a method of data compression includes identifying a plurality of irredundant patterns in a data set, and extracting at least a portion of the plurality of irredundant patterns from the data set to generate a compressed data set. Further, the plurality of irredundant patterns may be identified according to an irredundant pattern discovery algorithm (e.g., as described above).

The present invention also includes a programmable storage medium tangibly embodying a program of machine-readable instructions executable by a digital processing apparatus to perform the inventive method.

The present invention also includes a method for deploying computing infrastructure in which computer-readable code is integrated into a computing system, and combines with the computing system to perform the inventive method.

With its unique and novel features, the present invention provides an apparatus, system and method of data compression having an improved compression performance over conventional data compression techniques.

BRIEF DESCRIPTION OF THE DRAWINGS

The foregoing and other objects, aspects and advantages will be better understood from the following detailed description of the embodiments of the invention with reference to the drawings, in which:

FIG. 5 provides Table 1 which illustrates experimentally-obtained data regarding lossy compression of gray-scale images;

FIG. 6 provides Table 2 which illustrates experimentally obtained data regarding lossy compression of binary images;

FIG. 7 provides Table 3 which illustrates experimentally-obtained data regarding lossy compression of music;

FIG. 8 provides Table 4 which illustrates experimentally-obtained data regarding lossy vs. lossless performance;

FIG. 9 provides Table 5 which illustrates experimentally-obtained data regarding lossless compression of the Calgary Corpus;

FIG. 10 provides Table 6 which illustrates experimentally-obtained data regarding lossless compression of sequences from DNA yeast families;

FIG. 11 provides Table 7 which illustrates experimentally-obtained data including a synopsis of compression rates for sequences in the yeast DNA by various lossless methods;

FIG. 12 provides Table 8 which illustrates experimentally-obtained data regarding compression, fidelity and loss in reconstruction of grey-scale images;

FIG. 17 illustrates two versions of the opening passage from the Book 1 of the Calgary Corpus.

DETAILED DESCRIPTION OF THE EMBODIMENTS OF THE INVENTION

Figure 1:
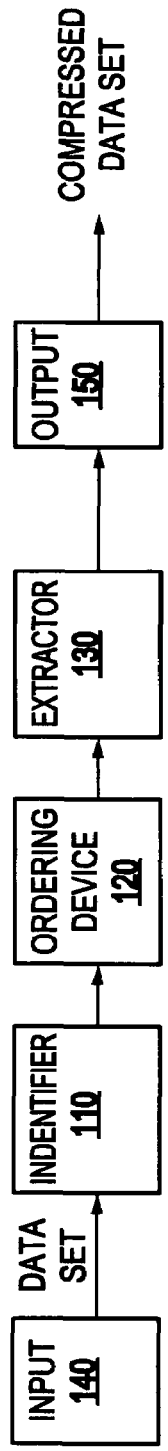
FIG. 1 illustrates an inventive apparatus 100 according to an exemplary aspect of the present invention.

Referring now to the drawings, FIG. 1 illustrates an apparatus 100 for data compression according to an exemplary aspect of the present invention. As illustrated in FIG. 1, the inventive apparatus 100 includes an identifier 110 which identifies a plurality of irredundant patterns in a data set, and an extractor 120 which extracts at least a portion of the plurality of irredundant patterns from the data set to generate a compressed data set.

The inventive apparatus 100 may also include, for example, an ordering device 130 which orders the plurality of irredundant patterns according to a frequency of occurrence in the data set. In addition, the apparatus 100 may include an input 140 for inputting the data set, and an output 150 for outputting the compressed data set.

Further, many of the above described elements (e.g., identifier 110, extractor 120, ordering device 130, input 140 and output 150) of the inventive apparatus 100 may be contained within a single unit (e.g., a microprocessor). Alternatively, these elements may be separately provided (e.g., a plurality of microprocessors) as illustrated, for example, in FIG. 1.

Specifically, the inventive apparatus 100 may be used to compress any form of data where it would be beneficial to reduce the size of the data (e.g., to facilitate storage or transmission of the data). For example, the inventive apparatus 100 may be part of a display system for displaying images or text, a printing system for printing images or text data, a music system for recording and/or reproducing music music data, or genetic sequencing system.

Figure 2:
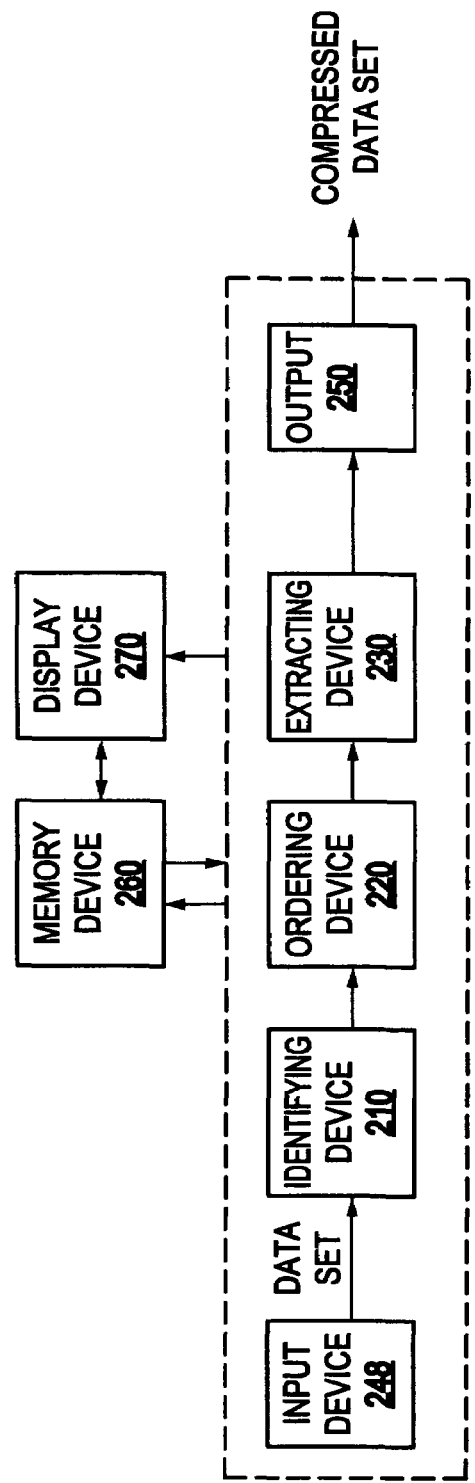
FIG. 2 illustrates an inventive system 200 according to an exemplary aspect of the present invention.

FIG. 2 illustrates a system 200 for data compression according to an exemplary aspect of the present invention. As illustrated in FIG. 2, the inventive system 200 includes an identifying device 210 which identifies a plurality of irredundant patterns in a data set, and an extracting device 220 which extracts at least a portion of the plurality of irredundant patterns from the data set to generate a compressed data set.

The inventive system 200 may also include, for example, an input device 240 (e.g., a keyboard, mouse, etc.) for inputting the data set, ordering device 230 which orders the plurality of irredundant patterns according to a frequency of occurrence in the data set, and an output device 250 for outputting the compressed data set. (e.g., to a display device, audio device, video device, printer, etc.). The system 100 may also include a memory device 260 for storing information (e.g., the data set, an irredundant pattern discovery algorithm, input parameters for the algorithm, the compressed data set, etc.) and a display device 270 for displaying text or images corresponding to the data set and/or the compressed data set.

Generally, the present invention may include a data compression technique which involves the notion of a motif, interpreted here as a string of intermittently solid and wild characters that recurs more or less frequently in an input sequence or family of sequences. This notion arises originally in the analysis of sequences, particularly biomolecules, due to its multiple implications in the understanding of biological structure and function, and it has been the subject of various characterizations and study.

Correspondingly, motif discovery techniques and tools have been devised. This task is made hard by the circumstance that the number of motifs identifiable in general in a sequence can be exponential in the size of that sequence. A significant gain in the direction of reducing the number of motifs is achieved through the introduction of irredundant motifs, which in intuitive terms are motifs of which the structure and list of occurrences cannot be inferred by a combination of other motifs' occurrences.

Remarkably, the number of irredundant motifs in a sequence is at worst linear in the length of that sequence. Although suboptimal, the available procedures for the extraction of such motifs are not prohibitively expensive.

The inventors, however, have discovered that irredundant motifs can be usefully exploited in lossy compression methods based on textual substitution and suitable for signals as well as text. Actually, once the motifs in the inventive lossy encodings are disambiguated into corresponding lossless codebooks, the motifs still prove capable of yielding savings over conventional methods in use. Preliminary experiments with these fungible strategies at the crossroads of lossless and lossy data compression show performances that improve over popular methods by more than 20% in lossy and 10% in lossless implementations.

More specifically, the present invention follows an approach based on the notion of a motif, a kind of redundancy emerged particularly in molecular biology and genomic studies. In loose terms, a motif consists of a string of intermittently solid and wild characters, and appearing more or less frequently in an input sequence. Because motifs seem to be implicated in many manipulations of biological as well as more general sequences, techniques for their discovery are of broad interest.

In a nutshell, the role of motifs in the constructions of the present invention is to capture the auto-correlation in the data by global pattern discovery. The combinatorial structure of the motifs in the present invention is engineered to minimize redundancy in the "codebook". The presence of a controlled number of "don't care" characters enhances the compression achievable in the subsequent stage of off-line greedy textual substitution.

In general, the motif discovery and use is made particularly difficult by the fact that the number of candidate motifs in a sequence grows exponentially with the length of that string. Fortunately, a significant reduction in the basis of candidate motifs is possible in some cases. In the context of the textual substitution schemes in the present invention, for instance, it is natural to impose that the motif chosen at each iteration satisfy certain maximality conditions that prevent forfeiting information gratuitously.

To begin with, once a motif is chosen it seems reasonable to exploit the set of its occurrences to the fullest, compatibly with self-overlaps. Likewise, it seems reasonable to exclude from consideration motifs that could be enriched in terms of solid characters without prejudice in the corresponding set of occurrences.

Recently, the class of motifs called "irredundant" has been identified along these lines that grows linearly with input size. The present invention may include the application of such motifs to various scenarios of lossy and lossless compression. As it turns out, significant savings can be obtained with this approach.

Notions and Properties

Let $s=s_1 s_2 \ldots s_n$ be a string of length $|s|=n$ over an alphabet $\Sigma$. The term "$suf_i$" is used herein to denote the suffix $s_i s_{i+1} \ldots s_n$ of s. A character from $\Sigma$, say $\sigma$, is called a solid character and '.' is called a "don't care" character.

Definition 1 ($\sigma<,=,\leq\sigma$): If $\sigma_1$ is a don't care character then $\sigma_1<\sigma_2$. If both $\sigma_1$ and $\sigma_2$ are identical characters in $\Sigma$, then $\sigma_1=\sigma_2$. If either $\sigma_1<\sigma_2$. or $\sigma_1=\sigma_2$. or holds, then $\sigma_1\leq\sigma_2$ . . .

Definition 2 (p occurs at l, Cover): A string, p, on $\Sigma \cup$'.', occurs at position l in s if $p[j]\leq s[l+j-1]$ holds for $1\leq j\leq|p|$. String p is said to cover the interval $[l,l+|p|-1]$ no s.

A motif is any element of $\Sigma$ or any string on $\Sigma\bullet(\Sigma\cup\{.\})^*\bullet\Sigma$.

Definition 3 (Motif m, Location list $L_m$): Given a string s on alphabet $\Sigma$ and a positive integer, k, $k\leq|s|$, a string m on $\Sigma\cup$'.' is a motif with location list $L_m=(l_1, l_2, \ldots, l_p))$, if all of the following hold:

(1) $m[1], m[|m|]\epsilon\Sigma$;
(2) $p\geq k$, and
(3) there does not exist a location l, $l\neq l_i$, $1\leq i\leq p$ such that m occurs at l on s (the location list is of maximal size).

The first condition ensures that the first and last characters of the motif are solid characters. If don't care characters are allowed at the ends, the motifs can be made arbitrarily long in size without conveying any extra information. The third condition ensures that any two distinct location lists must correspond to distinct motifs.

For purposes of the present invention, a motif that occurs at least k times will be called a k-motif. Consider s=abcdabcd. Using the definition of motifs, the different 2-motifs are as follows: $m1$=ab with $Lm_1=\{1, 5\}$, $m_2$=bc with $Lm_2=\{2, 6\}$, $m_3$=cd with $Lm_3=\{3, 7\}$, $m_4$=abc with $Lm_4=\{1, 5\}$, $m_5$=bcd with $Lm_5=\{2, 6\}$ and $m_6$=abcd with $Lm_6=\{1, 5\}$.

It should be noted that $Lm_1=Lm_4=Lm_6$ and $Lm_2=Lm_5$. Using the notation $L+i=\{x+i|x\epsilon L\}$, $Lm_5=Lm_6+1$ and $Lm_3=Lm_6+2$ hold. The motif $m_6$ is maximal as $|m_6|>|m_1|$, $|m_4|$ and $|m_5|>|m_2|$. Motifs $m_1$, $m_2$, $m_3$, $m_4$ and $m_5$ are non-maximal motifs.

In intuitive terms, a motif m is maximal if it cannot be made more specific or longer while retaining the list Lm of its occurrences in s. The definition of maximality is given below.

Definition 4 ($m_1\leq m_2$): Given two motifs $m_1$ and $m_2$ with $|m_1|\leq|m_2|$, $m_1\leq m_2$ holds if $m_1[j]\leq m_2[j+d]$, with $d\geq 0$ and $1\leq j\leq|m_1|$.

It is also said in this case that $m_1$ is a sub-motif of $m_2$, and that $m_2$ implies or extends or covers $m_1$. If, moreover, the first characters of $m_1$ and $m_2$ match then $m_1$ is also called a prefix of $m_2$. For example, let $m_1$=ab . . . e, $m_2$=ak . . . e and $m_3$=abc . . . e.g. Then $m_1\leq m_3$, and $m_2\not\leq m_3$. The following lemma is straightforward to verify.

Lemma 1: If $m_1\leq m_2$, then $Lm_1\supseteq Lm_2+d$ and if $m_1\leq m_2$, $m_2\leq m_3$, then $m_1\leq m_3$.

Definition 5 (Maximal Motif): Let $m_1, m_2, \ldots, M_k$ be the motifs in a string s. A motif $m_i$ is maximal in composition if and only if there exists no $m_l$, $l\neq i$ with $Lm_i=Lm_1$ and $m_i\leq m_l$.

A motif $m_j$, maximal in composition, is also maximal in length if and only if there exists no motif $m_j$, $j \neq i$, such that $m_i$ is a sub-motif of $m_j$ and $|Lm_i|=|Lm_j|$. A maximal motif is a motif that is maximal both in composition and in length.

Requiring maximality in composition and length limits the number of motifs that may be usefully extracted and accounted for in a string. However, the notion of maximality alone does not suffice to bound the number of such motifs. It can be shown that there are strings that have an unusually large number of maximal motifs without conveying extra information about the input.

A maximal motif m is irredundant if m and the list Lm of its occurrences cannot be deduced by the union of a number of lists of other maximal motifs. Conversely, we call a motif m redundant if m (and its location list Lm) can be deduced from the other motifs without knowing the input string s. More formally:

Definition 6 (Redundant motif): A maximal motif m, with location list Lm, is redundant if there exist maximal sub-motifs $m_j$, $1 \leq i \leq p$, such that $Lm=Lm_1 \cup Lm_2 \ldots \cup Lm_p$, (i.e., every occurrence of m on s is already implied by one of the motifs $m_1, m_2, \ldots, m_p$).

Definition 7 (Irredundant motif). A maximal motif that is not redundant is called an irredundant motif.

For purposes of the present invention, $B_i$ is used to denote the set of irredundant motifs in $suf_i$. Set $B_i$ is called the basis for the motifs of $suf_i$. Thus, in particular, the basis B of s coincides with $B_1$.

Definition 8 (Basis). Given a sequence s on an alphabet $\Sigma$, let M be the set of all maximal motifs on s. A set of maximal motifs B is called a basis of M if the following hold: (1) for each m∈B, m is irredundant with respect to B−{m}, and, (2) let G(X) be the set of all the redundant maximal motifs generated by the set of motifs X, then, M=G(B).

In general, $|M|=\Omega(2^n)$. The natural attempt now is to obtain as small a basis as possible. Before discussing that, some basic types of maximality should be examined.

Lemma 2: Let m be a maximal motif with no don't care and $|Lm|=1$, then m=s.

Proof: Any motif with those properties can be completed into s, by the notion of maximality.

Lemma 3: Let m be a maximal motif with at least one don't care, then $|Lm|\geq 2$.

Proof: Under the hypothesis, it must be $|m|>1$. The rest is a straightforward consequence of the notion of maximality.

Lemmas 2 and 3 indicate that, other than the string s itself and the characters of the alphabet, the only maximal motifs of interest have more than one occurrence. Solid motifs (e.g., motifs that do not contain any don't care symbol) enjoy a number of nice features that make it pedagogically expedient to consider them separately.

Let the equivalence relation $\equiv_s$ be defined on a string s by setting $y \equiv_s w$ if $L_y = L_w$. It should be recalled that the index of an equivalence relation is the number of equivalence classes in it. The following fact shows that the number of maximal motifs with no don't care characters is linear in the length of the textstring. It descends from the observation that for any two substrings y and w of s, if $L_w \cap L_y$ is not empty, then y is a prefix of w or vice versa.

Fact 1: The index k of the equivalence relation $\equiv_x$ obeys $k \leq 2n$.

When it comes to motifs with at least one don't care character, it is desirable to obtain as small a basis as possible. Towards this, let x and y be two strings with $m=|x| \leq |y|=n$. The consensus of x and y is the string $z_1 z_2 \ldots z_m$ on $\Sigma \cup $ '.' defined as: $z_i = x_i$ if $x_i = y_i$ and $z_i = $ '.' otherwise (i=1, 2, ..., m). Deleting all leading and trailing don't care symbols from z yields a (possibly empty) motif that is called the meet of x and y. The following general property shows that the irredundant 2-motifs are to be found among the pairwise meets of all suffixes of s.

Theorem 1: Every irredundant 2-motif in s is the meet of two suffixes of s.

An immediate consequence of Theorem 1 is a linear bound for the cardinality of our set of irredundant 2-motifs: by maximality, these motifs are just some of the n−1 meets of s with its own suffixes.

Proof of Theorem 1: Let m be a 2-motif in B, and $L_m$ ($l_1, l_2, \ldots, l_p$) be its occurrence list. The claim is true for p=2. Indeed, let $i=l_1$ and $j=l_2$, and consider the meet m' of $suf_i$ and $suf_j$. By the maximality in composition of m, it should be that $m' \leq m$. On the other hand, for any motif m with occurrences at i and j, it should be that $m \leq m'$, whence, in particular, $m \leq m'$. Thus, m=m'.

Assume now $p \geq 3$ and that there is no pair of indices i and j in $L_m$ such that m is the meet of $suf_i$ and $suf_j$. Again, for any choice of i and j in $L_m$, it should be that $m \leq m'$, where m' denotes as before the meet of $suf_i$ and $suf_j$. Therefore, it should be that $m \leq m'$ but $m \neq m'$ for all choices of i and j.

Assume now one such choice is made. By the maximality of m, it cannot be that m' is the meet of all suffixes with beginning in $L_m$. Therefore, there must be at least one index k such that m' differs either from the meet of $suf_k$ and $suf_i$ or from the meet of $suf_k$ and $suf_j$, or from both.

Let, to fix the ideas, m" be this second meet. Since $m \leq m"$ and $m \leq m'$ then $L_{m'}$ and $L_{m"}$ are sublists of $L_m$, by Lemma 1. In other words, $L_m$ can be decomposed into two or more lists of maximal motifs such that their union implies m and its occurrences. But this contradicts the assumption that m is irredundant.

Theorem 2: The number of irredundant 2-motifs in a string x of n characters is O(n).

With its underlying convolutory structure, Theorem 1 suggests a number of immediate ways for the extraction of irredundant motifs from strings and arrays, using available pattern matching with or without fast fourier transform (FFT).

Specific "incremental" algorithms are also available that find all irredundant 2-motifs in time $O(n^3)$. There the paradigm explored is that of iterated updates of the set of base motifs $B_i$ in a string under consecutive unit symbol extensions of the string itself. Such an algorithm is thus incremental and single-pass, which may lend itself naturally to applications of the kind considered here.

The construction used for the experiments conducted by the present inventors takes into account additional parameters related to the density of solid characters, the maximum motif length and minimum allowed number of occurrences. For the sake of self consistency, this algorithm and its complexity are highlighted next. However, it should be noted that the present invention should not be limited to concentrating solely on computational efficiency.

The Pattern Discovery Algorithm

The algorithm may begin by computing one-character patterns and then successively concatenating motifs pairwise until this growth must stop. One drawback of this approach is that the number of patterns at each step grows very rapidly. This is contrasted by trimming the number of growing patterns at each step and using the linearity of 2-motifs to bound their number by O(n). Thus, the basis can be detected in polynomial time. In the next step the remaining motifs from the basis is computed in time "proportional" to their number.

Two operators may be first defined. Further, there exists two problems on sets—the Set Intersection Problem (SIP)

and the Set Union Problem (SUP) that are used in the pattern discovery algorithm in the following discussion. Parts of this section are presented below to keep the discussion self-contained.

Binary AND operator, $m_1 \oplus m_2$: $m=m_1 \oplus m_2$, where m is such that $m \leq m_1$, $m_2$ and there exists no motif m' with $m \leq m' \leq m^1, m_2$. For example if $m_1 = A.D.^{[2,4]}G$ and $m_2 = AB.^{[1,5]}FG$. Then, $m = m_1 \oplus m_2 = A \ldots ^{[2,4]}G$.

Binary OR operator, $m_1 \oplus m_2$: $m=m_1 \oplus m_2$, where m is such that $m_1, m_2 \leq m$ and there exists no motif m' with $m_1$, $m_2 \leq m' \leq m$.

The Set Intersection Problem, SIP (n, m, l). Given n sets $S_1$, $S_2, \ldots, S_n$, on m elements, find all the N distinct sets of the form $S_{i1} \cap S_{i2} \cap \ldots \cap S_{ip}$ with $p \geq 1$. Notice that it is possible that $N = O(2^n)$.

For example, the present invention may utilize an O(N log n+mn) algorithm to obtain all the intersection sets. An example of such an algorithm is as follows:

Given n sets $S_1, S_2, \ldots, S_n$, on m elements, find all the N distinct sets of the form $S_{i1} \cap S_{i2} \cap \ldots \cap S_{ip}$ with $p \geq 1$. An O(N log n+mn) algorithm is provided below to obtain all the intersection sets.

Let the elements be numbered 1 ... m. Construct a binary tree T using the subroutine CREATE-NODE shown below.

Assume a function CREATE-SET(S) which creates S, a subset of $S_1, S_2, \ldots, S_n$ in an appropriate data structure D (say a tree). A query of the form if a subset $S \in D$ (DOESEXIST(S)) returns a True/False in time O(log n).

```
Node CREATE-NODE (S, h, l)
{
    (1) New(this-node)
    (2) CREATE-SET(S)
    (3) LetS'={S_i∈S|h∈S_i}
    (4) if((|S'| ≧ l) and not DOES-EXIST(S') and (h ≧ 2))
    (5) Left-child CREATE-NODE(S', h − 1, l)
    (6) Right-child = CREATE-NODE(S, h − 1, l)
    (7) return (this-node)
}
```

For l=2, there is exactly one node the tree T. For l>2, the initial call is CREATE-NODE ($\{S_1, S_2, \ldots, S_n\}$, m, l). Clearly, all the unique intersection sets, which are N in number are at the leaf node of this tree T. Also, the number of internal nodes can not exceed the number of leaf nodes, N. Thus the total number of nodes of T is O(N).

The cost of query at each node is O(log n) (line (4) of CREATE-NODE). The size of the input data is O(nm) and each data item is read exactly once in the algorithm (line (3) of CREATE-NODE). Hence, the algorithm takes O(N log n+nm) time.

The Set Union Problem, SUP (n, m). Given n sets $S_1, S_2 \ldots S_n$ on m elements each, find all the sets $S_i$ such that $S_i = S_{i1}$, $\cup S_{i2} \cup \ldots \cup S_{ip}$ $i \neq ij$, $1 \leq j \leq p$. An example of an algorithm which may be used to solve this problem in time $O(n^2 m)$ is as follows:

Given n sets $S_1, S_2, \ldots, S_n$ on m elements each, find all the sets $S_i$, such that $S_i = S_{i1}, \cup S_{i2} \cup \ldots \cup S_{ip}$ $i \neq ij$, $1 \leq j \leq p$.

This is a very straightforward algorithm (this contributes an additive term to the overall complexity of the pattern detection algorithm): For each set $S_i$, we first obtain the sets $S_j \neq i$, $j = 1 \ldots n$ such that $S_j \subset S_i$. This can be done in O(nm) time (for each i).

Next, $\cup_j S_j = S_i$ is checked. Again this can be done in O(nm) time. Hence the total time taken is $O(n^2 m)$.

Input Parameters: The input parameters may include, for example, (1) the string s of length n, (2) the minimum number of times a pattern must appear k, and (3) the maximum number of consecutive '.' characters D allowed in a motif. This list, however, is not intended to be limiting.

For the rest of the algorithm, it will be assumed that the alphabet size $|\Sigma| = O(1)$. Also let $m_1.^d m_2$ denote the string obtained by concatenating the elements $m_1$ followed by d '.' characters followed by the element $m_2$. Also, let $L_m = \{i | m$ occurs at i on s$\}$.

Computing the Basis

The algorithm may proceed in the following steps. M is the set of motifs being constructed.

1. $M' \leftarrow \{m = \sigma_1.^d \sigma_2 | 0 \leq d \leq D$, m occurs at least k times$\}$
   Let $M \leftarrow M'$.
2. (a) Let $m = m_1 + m_2$ denote the concatenation of motifs $m_1$ and $m_2$ which satisfy $m_1[|m_1|] = m_2[1]$ and m is the concatenation of the two motifs without repeating the first character of $m_2$ in m. m is defined only when the last character of mlis the same as the first character of $m_2$.
   For each $m_1 \in M$
     For d=0 ... D
       For each $m_2 = \sigma_1.^d \sigma_2 \in M'$, for some $\sigma_1, \sigma_2 \in \Sigma$
       Construct $Lm = m_1 + m_2 = \{i | i \in Lm_1$
       and $(i + |m_1|) \in Lm_2\}$
       $M \leftarrow M \cup \{m\}$
       and if $|Lm| = |Lm_1|$, then $M \leftarrow M - \{m_j\}$
   (b) Let $M'' = \{m' \in M | m' \leq m \in M$
       and $|Lm| = |Lm'|\}$ and $M \leftarrow M - M''$.
       Further, $M \leftarrow M - M'$.
   (c) For each $m_i \in M$
       If $m_{i1}, m_{i2}, \ldots m_{ip}, p \geq 1$
       with $Lm_i = Lm_{i1} \cup Lm_{i2} \ldots \cup Lm_{ip}$
       then $M \leftarrow M - \{m_i\}$. Also, $m_{ij} \leftarrow m_i \oplus m_{ij}$
   The above is solved using an instance of the SUP( ) problem.
3. The previous step is repeated until no changes occur to M.
4. (a) Let $M'' = \{m \in M | |Lm| < k\}$. Solve the general motif computation problem for M'' to obtain M'''. Update $M \leftarrow M \cup M'''$ For example, a general (maximal) motif m is of the form $m_1 \oplus m_2 \oplus \ldots \oplus m_p$ for some p and $L_m = L_{m1} \cup L_{m2} \cup \ldots \cup L_{mp}$. The following examples show that a straightforward approach of combining (using the operator $\oplus$) compatible[1] motifs does not give the desired time complexity.

EXAMPLE 1

Let $m_1 = ab \ldots d, _m2 = a \ldots cd, m_3 = a.e \ldots d, m_4 = a \ldots f.d$ with $L_{m1} = \{10, 20\}, L_{m^i} = \{30, 40\}, L_{m3} = \{20, 40\}, L_{m4} = \{10, 30\}$. Then $L_{m5} = L_{m1}, \cup L_{m2} \cup L_{m3} \cup L_{m4}, L_{m6} = L_{m2} \cup L_{m3} \cup L_{m4}, L_{m7} = L_{m1} \cup L_{m3} \cup L_{m4}, L_{m8} = L_{m1} \cup L_{m2} \cup L_{m4}, L_{m9} = L_{m1} \cup L_{m2} \cup L_{m3}$ are such that $m_5 = m_6 = m_7 = m_8 = m_9 = a \ldots d$. In other words, the motif $m_5$ is constructed at least four more times than required.

An output-sensitive algorithm is given below to compute all the general motifs.

Given B a set of maximal motifs, construct P a set of subsets of B as follows: $P \in P$, if for each motif $m_i, m_j \in P$, without loss of generality, $m_i[1] = m_j[1]$ and P is the largest such set. For each $P \in P$, we construct an instance of the Set Intersection Problem SIP as follows:

It is straightforward to see that the union of the solutions to each of the SIP gives all the maximal motifs. This can be accomplished in time O(N log n) by using the algorithm for the Set Intersetcion Problem (SIP). This is illustrated through an example (e.g., the correctness of the algorithm is left as an exercise for the reader). It should be recalled that N is the number of general (maximal) motifs and n is the length of the input sequence.

For each P∈P do the following. Let $l=\max_{m\in P}$. Construct m[i], $2\leq i\leq l$ as follows. m[i]={σ≠'.'|σ≦p[i], p∈P}. Note that it is possible that m[i]={ } for some i. Now construct an instance of SIP (N'M, 2) as follows. The M elements on which the sets are built is a subset of the basis set and M=|P|. The N' sets are constructed as follows. $S_e^j=\{m_i|m[j]=e\}$ for all possible values of j and e and $|S_e^j|\geq 2$. Assuming that $\Sigma=O(1)$, the number of such sets N'=O(n). Recall that n is length of the input string s whose motifs are being discovered. Each $S_e^j$ with $|S_e^j|\geq 2$ corresponds to a maximal motif.

As an illustration, consider the following example.

EXAMPLE 2

Figures 3, 4:
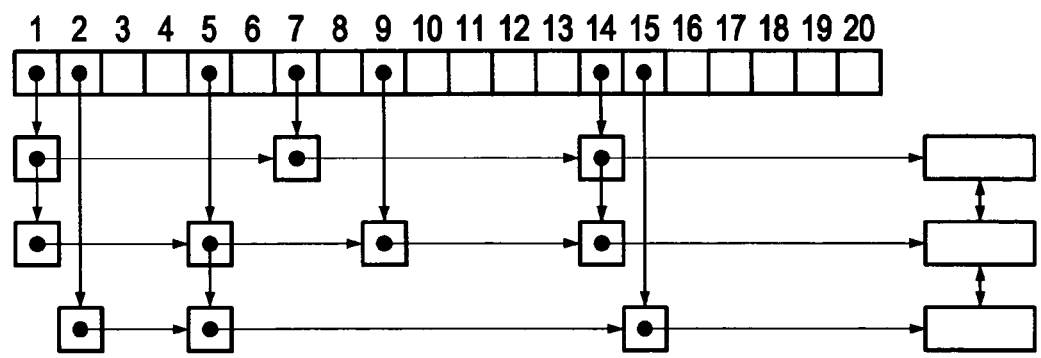
FIG. 3 illustrates an example of a matrix constructed for example motifs $m_1 \ldots m_5$.
FIG. 4 is a flowchart illustrating the concept of threading motifs and their occurrences according to an exemplary aspect of the present invention.

Let $m_1$=abc.d, $m_2$=abe, $m_3$=add.d, $m_4$=ad...e, $m_5$=aba.d. Here l=5 and $S_b^2=\{m_1, m_2, m_5\}$, $S_b^2=\{m_3, m_4\}$, $S_d^5=\{m_1, m_3, m_5\}$. FIG. 3 illustrates an example of a matrix constructed for example motifs $m_1 \ldots m_5$;

Each of the sets corresponds to a maximal motif. For example $S_b^2$ gives the maximal motif $m_1 \oplus m_2 \oplus m_5$=ab with location list $L_{m1} \cup L_{m2} \cup L_{m5}$, $S_d^2$ gives $m_3 \oplus m_4$=ad with location list $Lm3 \cup L_{m4}$, $m_1 \oplus m_3 \oplus m_5$=a . . . d with $S_d^5$ gives location list $L_{m1} \cup L_{m3} \cup L_{m5}$. The results from SIP give the unique intersection set $\{m_1, m_5\}$ and this corresponds to the motif $m=m_1 \oplus m_5$=ab . . . d with $L_m=L_{m1} \cup L_{m5}$.

(b) Let M"={m∈M||Lm|<k} and M←M−M".
(c) Let M"={m∈M|m≦m'≠m∈M and |Lm|=|Lm'|} and M←M−M".

In the above algorithm, Step 2-c, ensures that no motif is generated whose location list is a union of other discovered motifs. Step 4-a ensures that any motif that is missed out in the elimination process is re-constructed efficiently. Hence the algorithm is correct.

Implementation and Preliminary Experiments

Each phase of our steepest descent paradigm alternates the selection of the pattern to be used in compression with the actual substitution and encoding. The sequence representation at the outset is finally pipelined into some of the popular encoders and the best one among the overall scores thus achieved is retained. By its nature, such a process makes it impossible to base the selection of the best motif at each stage on the actual compression that will be conveyed by this motif in the end.

The decision performed in choosing the pattern must be based on an estimate, that also incorporates the peculiarities of the scheme or rewriting rule used for encoding. In practice, the inventors estimate at log i the number of bits needed to encode the integer i.

In one scheme described by one of the co-inventors herein, (hereafter, $Codec_1$) all occurrences of m are elminated, and recorded in succession are m, its length, and the total number of its occurrences followed by the actual list of such occurrences. Letting |m| to denote the length of m, $f_m$ the number of occurrences of m in the textstring, |Σ| the cardinality of the alphabet and n the size of the input string, the compression brought about by m is estimated by subtracting from them $f_m$|m|log|Σ| bits originally encumbered by this motif on s, the expression |m||Σ|+log|m|+$f_m$log n+log$f_m$ charged by encoding, thereby obtaining:

G(m)

$$(f_m-1)|m|\log|\Sigma|||-\log|m|-f_m\log n-\log f_m. \quad (1)$$

This is accompanied by a fidelity loss L(m) represented by the total number of don't cares introduced by the motif, expressed as a percentage of the original length. If d such gaps were introduced, this would be:

$$L(m) = \frac{d\log|\Sigma|}{f_m|m|\log|\Sigma|} = \frac{d}{f_m|m|}. \quad (2)$$

Other encodings are possible. For example, in one scheme (hereafter, $Code_2$), for example, every occurrence of the chosen pattern m is substituted by a pointer to a common dictionary copy, and one bit should be added to distinguish original characters from pointers. The space originally occupied by m on the text is in this case (log |Σ|+1)$f_m$|m|, from which one subtracts |m|log|Σ|+log|m|+log|m|+$f_m$ (log d+1), where d is the size of the dictionary, in itself a parameter to be either fixed a priori or estimated.

FIGS. 4 through 13D provide tables and figures which were obtained from preliminary experiments. The major burden in computations is posed by the iterated updates of the motif occurrence lists, that must follow the selection of the best candidate at each stage. This requires maintaining motifs with their occurrences in a doubly linked list as illustrated, for example, in FIG. 4.

That is, following each motif selection, the positions of the text covered by its occurrences are scanned horizontally. Next, proceeding vertically from each such position, the occurrences of other motifs are removed from their respective lists.

To keep time manageable, most of the experiments were based on a small number of iterations, typically in the range 250-3,000. For Bookl, for instance, more than 30 k motifs could be extracted. Each one of these would convey some compression if used, but time constraints allowed only less than 10% to be implemented.

In the pattern discovery stage, a maximum length for motifs was enforced at about 40 to 50 characters, and a threshold of 5 or 6 was put on the overall number of don't care allowed in a single motif, irrespective of its length. The collection of these measures made it possible to test the method on a broad variety of inputs. By the same token, the resulting scores represent quite a conservative estimate of its potential.

The Tables illustrated in FIGS. 5-12 summarize scores related to various inputs under various acceptances of loss. For example, FIG. 5 provides Table 1 which refers to 8-bit grey-level images as a function of the don't care density allowed (last column). FIG. 6 provides Table 2 which shows results on black and white pictures. These are similar except in this case the loss of one bit translates into that of 1 byte.

By their nature, binary or dithered images such as in facsimile transmission seem to be among the most promising applications of our method. At the same time, it has already been reported that "directional" lossy textual substitution methods can compete successfully even with chrominance oriented methods like the Joint Photographic Experts Group (JPEG) Standard. In view of reported results, off-line lossy variants of the kind presented here should perform just as well and probably better.

FIG. 7 provides Table 3 which shows results for musical records sampled at 8 bits. For this family of inputs, the motif extraction phase alone seems to present independent interest in applications of contents based retrieval.

FIGS. 9, 10 and 11 provide Tables 5, 6, and 7, respectively, which cover inputs from the Calgary Corpus and some yeast families (Note that the value in parentheses in Table 7 represents the percentage gain of $Codec_1$ versus other methods). DNA sequences represent interesting inputs for compression, in part because of the duality between compression and structural inference or classification, in part due to the well know resiliency of bio-sequences towards compression.

Particularly for text (it should be poined ourt that lossy compression of bio-sequences is a viable classification tool), lossy compression may be not very meaningful without some kind of reconstruction. As suggested at the beginning of the paper, this might be left to the user in some cases. Otherwise, FIG. 8 provides Table 4 which lists results obtained by exact completions of the motifs involved in implementation of all of our lossy schemata.

As illustrated in FIG. 8, Table 4 suggests that the bi-lateral context offered by motifs lends itself to better predictors than the traditional ones based on the left context alone. In any case, the iteration of motif extraction at several consecutive levels of hierarchy unveils structural properties and descriptors akin to unconventional grammars.

FIGS. 13A-13D are used to display encodings corresponding to the images from Table 1. That is, FIGS. 13A-13D illustrate examples of images corresponding to image data which was compressed according to an exemplary aspect of the present invention.

Figure 13A:
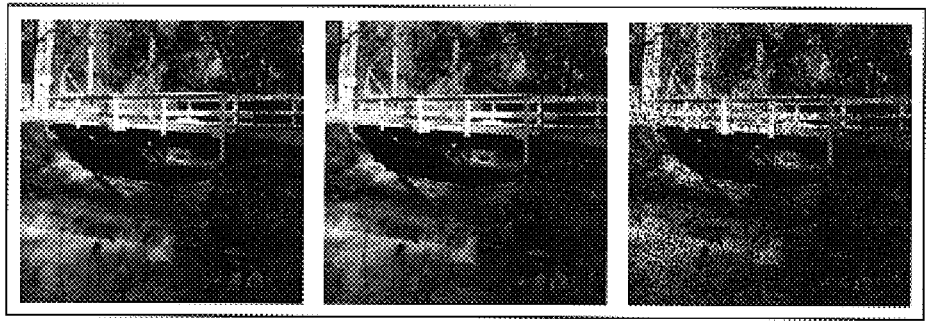
FIGS. 13A-13D illustrate examples of images corresponding to image data which was compressed according to an exemplary aspect of the present invention.
Figure 13B:
Figure 13C:
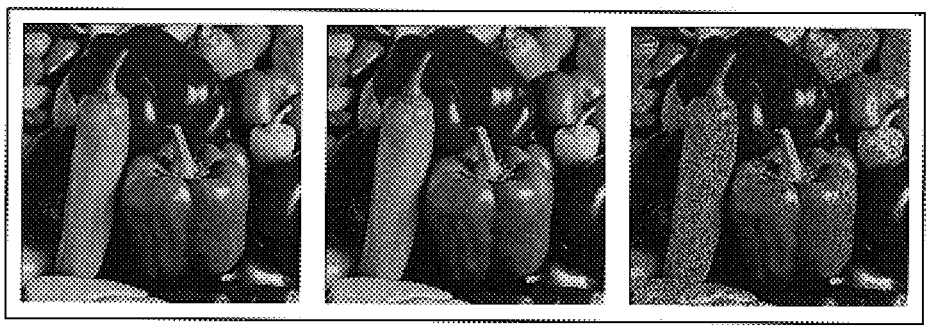
Figure 13D:

Specifically, FIG. 13A illustrates three images of a bridge, FIG. 13B illustrates three images of a camera, FIG. 13C illustrates three images of "Lena", and FIG. 13D illustrates three images of peppers. In each of these FIGS. 13A-13D the far left image is the orginal image (e.g., noncompressed image), the middle image is the reconstruction of the original image by interpolation of the two closest solid pixels, and in the far right image black dots are used to display the distribution of the don't care characters.

As shown in FIG. 13A, compression of the "bridge" at ¼ and ⅓ (shown) '.'/char densities yields savings of 6.49% and 17.84% respectively. Correspondingly, 0.31% and 12.50% of the pixels differ from original after reconstruction.

As shown in FIG. 13B, the lossy compression of the camera at ¼'.'/char density saves 11.60% over GZip. Only 6.67% of pixels differ from the original after reconstruction.

As shown in FIG. 13C, gains by Lena at ¼ and ⅓ (shown) '.'/char density are respectively of 10.13% and 25.33%, while interpolation leaves respectively 3.85% and 10.13% differences from the original. Further, as illustrated in FIG. 13D, for the peppers, the gains at ¼ and ⅓ (shown) '.'/char densities were respectively 14.09% (5.56% the correponding difference) and 25.30% (16.67% difference).

The single most relevant parameter here is represented by the density of don't care, which is reported in the last column of the table and also evidenced by the black dots injected in the images on the far right in FIGS. 13A-13D. As mentioned, the maximum length of motifs extracted had to be limited by practical considerations. Even so, it was found that images rarely produce motifs longer than a few tens of characters.

More severe consequences of these practical restrictions came from the need to limit the number of motifs actually deployed in compression, which was kept at those with at least 5 to 10 occurrences, corresponding to a quite limited dictionary of 1,000 to 2,000 entries. Interpolation was carried out by averaging from the two solid characters adjacent to each gap.

The corresponding discrepancies from the original pixel values reach into 16% in terms of % number of inexact pixels, but was found to be only a few percentage points if the variation in value of those pixels was measured instead as a percentage of the affected pixels (next to last column of Table 8 in FIG. 12), and entirely negligible (a fraction of a percent, see last column in Table 8 of FIG. 12) when averaged over all pixels. This is demonstrated in the reconstructed figures, that show little perceptible change.

As mentioned above, an important interest of the inventors was testing the breadth of applicability of the present invention, rather than bringing it to the limit on any particular class of inputs. In the experiments reported herein, the number of iterations (hence, motifs selected or vocabulary size) was in the range of 250 to 1,000 and slightly higher (3,000) for the Calgary Corpus.

The length of motifs was limited to few tens of characters and their minimum number of occurrences to 20 or higher. Typically, motifs in the tens of thousands were excluded from consideration on these grounds, which would have been provably capable of contributing savings.

In short, irredundant motifs seem to provide an excellent repertoire of codewords for compression and grammatical inference of documents of various kinds. Various completion strategies and possible extensions (e.g., to nested descriptors) and generalizations (notably, to higher dimensions) suggest that the notions explored here can develop in a versatile arsenal of data compression methods capable of bridging lossless and lossy textual substitution in a way that is both aesthetically pleasant and practically advantageous.

Further, algorithms for efficient motif extraction as well as for their efficient deployment in compression are highly desirable from this perspective. In particular, algorithms for computing the statistics for maximal sets of non-overlapping occurrences for each motif should be set up for use in gain estimations, along the lines of the constructions given in other reported methods for solid motifs.

Figure 14:
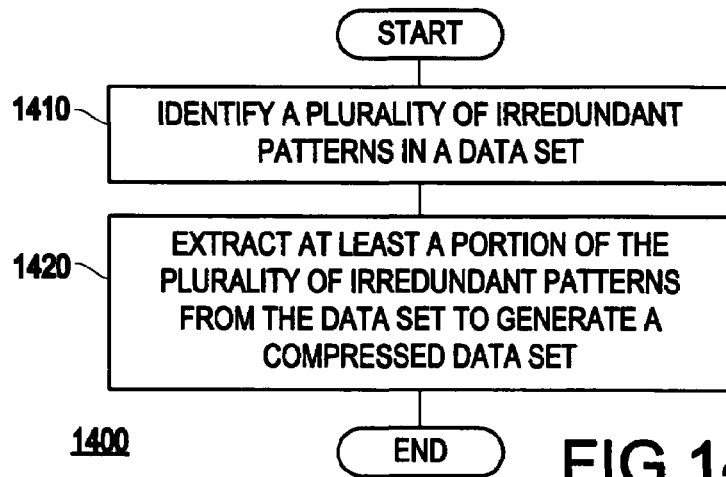
FIG. 14 is a flowchart illustrating an inventive method 1400 of data compression according to an exemplary aspect of the present invention.

Referring again to the drawings, FIG. 14 illustrates an inventive method 1400 of data compression according to an exemplary aspect of the present invention. As illustrated in FIG. 14, the inventive method 1400 includes identifying (1410) a plurality of irredundant patterns in a data set, and extracting (1420) at least a portion of the plurality of irredundant patterns from the data set to generate a compressed data set. For example, the inventive method 1400 may be performed using the inventive apparatus 100 or system 200, so that the features described above with respect to the inventive apparatus 100 and system 200 may be equally applicable to the inventive method 1400. Specifically, the inventive method 1400 may utilize the above-described irredundant patter discovery algorithm.

Figure 15:
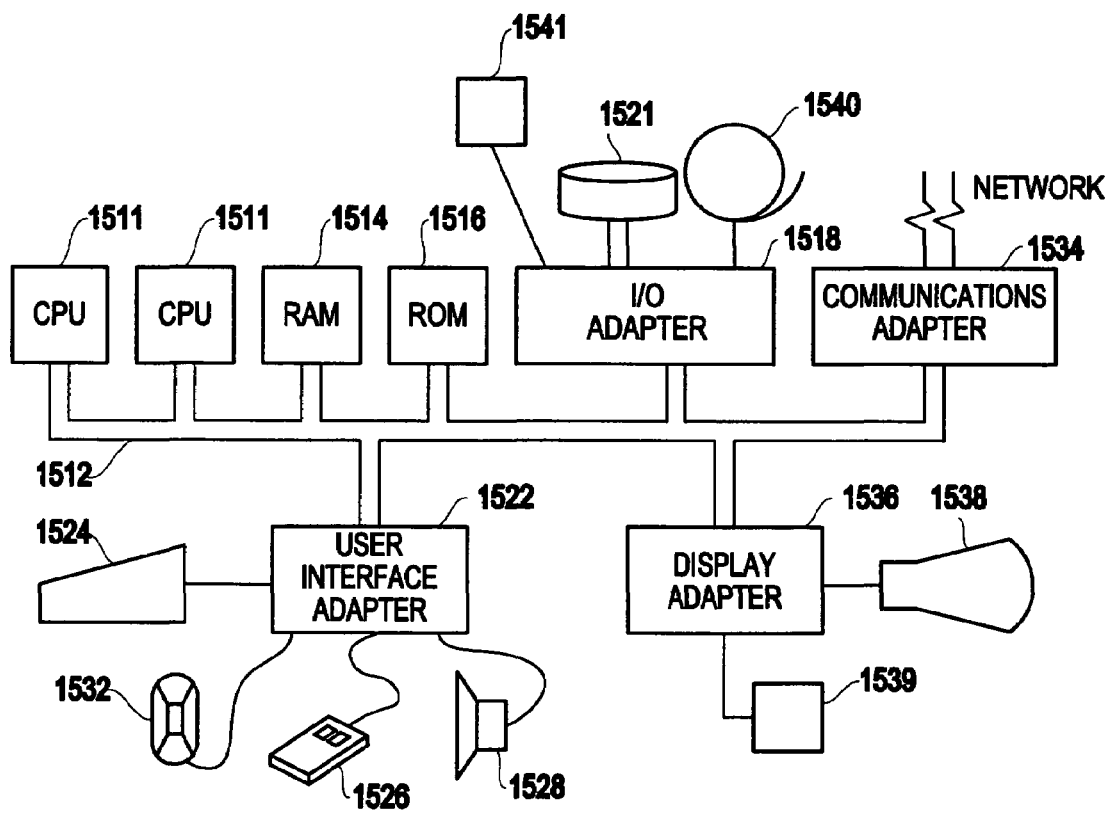
FIG. 15 illustrates a typical hardware configuration which may be used to implement the inventive apparatus, system and method for data compression.

Referring now to FIG. 15, system 1500 illustrates a typical hardware configuration which may be used to implement the inventive system and method for data compression. The configuration has preferably at least one processor or central processing unit (CPU) 1511. The CPUs 1511 are interconnected via a system bus 1512 to a random access memory (RAM) 1514, read-only memory (ROM) 1516, input/output (I/O) adapter 1518 (for connecting peripheral devices such as disk units 1521 and tape drives 1540 to the bus 1512), user interface adapter 1522 (for connecting a keyboard 1524, mouse 1526, speaker 1528, microphone 1532, and/or other user interface device to the bus 1512), a communication adapter 1534 for connecting an information handling system to a data processing network, the Internet, and Intranet, a personal area network (PAN), etc., and a display adapter 1536 for connecting the bus 1512 to a display device 1538 and/or printer 1539. Further, an automated reader/scanner 1541 may be included. Such readers/scanners are commercially available from many sources.

In addition to the system described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform the above method.

Such a method may be implemented, for example, by operating the CPU 1511 to execute a sequence of machine-readable instructions. These instructions may reside in various types of signal bearing media.

Thus, this aspect of the present invention is directed to a programmed product, signal-bearing media tangibly embodying a program of machine-readable instructions executable by a digital data processor incorporating the CPU 1511 and hardware above, to perform the method of the invention.

Figure 16:
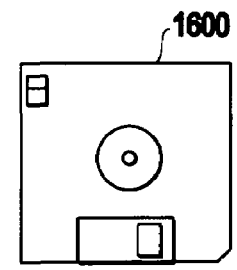
FIG. 16 illustrates a programmable storage medium 1600 tangibly embodying a program of machine-readable instructions executable by a digital processing apparatus to perform the inventive method.

This signal-bearing media may include, for example, a RAM contained within the CPU 1511, as represented by the fast-access storage for example. Alternatively, the instructions may be contained in another signal-bearing media, such as a magnetic data storage diskette 1600 (FIG. 16), directly or indirectly accessible by the CPU 1511.

Whether contained in the computer server/CPU 1511, or elsewhere, the instructions may be stored on a variety of machine-readable data storage media, such as DASD storage (e.g, a conventional "hard drive" or a RAID array), magnetic tape, electronic read-only memory (e.g., ROM, EPROM, or EEPROM), an optical storage device (e.g., CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may include software object code, complied from a language such as C+, C++ etc.

With its unique and novel features, the present invention provides an apparatus, system and method of data compression having an improved compression performance over conventional data compression techniques.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. An apparatus for data compression comprising:
    an identifier which identifies a plurality of irredundant patterns in a data set; and
    an extractor which extracts at least a portion of said plurality of irredundant patterns from said data set to generate a compressed data set,
    wherein said identifier identifies said plurality of irredundant patterns according to an irredundant pattern discovery algorithm, and
    wherein said irredundant pattern discovery algorithm comprises:
        initializing a set of irredundant patterns in said data set;
        constructing said set of irredundant patterns for each solid character;
        constructing location lists for said set of irredundant patterns, said set of irredundant patterns being iteratively adjusted based on said location lists until no further changes occur to said set of irredundant patterns; and
        updating said set of irredundant patterns.

2. The apparatus according to claim 1, wherein a more frequently occurring irredundant pattern is extracted before a less frequently occurring irredundant pattern.

3. The apparatus according to claim 1, further comprising:
    an ordering device which orders said plurality of irredundant patterns according to a frequency of occurrence in said data set.

4. The apparatus according to claim 1, further comprising:
    an input for inputting said data set; and an output for outputting said compressed data set.

5. The apparatus according to claim 1, wherein said at least a portion of said plurality of irredundant patterns extracted from said data set comprise irredundant patterns having a minumum frequency of occurrence.

6. The apparatus according to claim 1, wherein an irredundant pattern in said plurality of irredundant patterns comprises a maximal motif, said maximal motif and a location list of occurrences for said maximal motif being incapable of being deduced by a union of a number of location lists of other maximal motifs.

7. The apparatus according to claim 6, wherein said maximal motif is maximal in composition and maximal in length.

8. The apparatus according to claim 6, wherein said maximal motif is devoid of a don't care character.

9. The apparatus according to claim 1, wherein said data set comprises one of a character string and a character array.

10. The apparatus according to claim 1, further comprising:
    an input for inputting parameters for said irredundant pattern discovery algorithm, said parameters comprising a string length for said data set, a minimum number of times said irredundant pattern must appear in said data set to be extracted, and a maximum number of consecutive don't care characters allowed in said irredundant pattern.

11. The apparatus according to claim 1, wherein said data set comprises one of image data, text data, music data and genetic sequence data.

12. The apparatus according to claim 1, wherein said identifier and said extractor comprise a same device.

13. A facsimile machine comprising the apparatus according to claim 1.

14. A computer comprising the apparatus of claim 1.

15. A data compression/decompression system, comprising:
  the data compression apparatus according to claim 1; and
  a data decompression apparatus comprising:
    an identifier which identifies said irredundant patterns extracted from said data set in said data compression apparatus; and
    an inserter for inserting said extracted irredundant patterns from said data set, into said compressed data set, to reproduce said data set.

16. A programmable storage medium tangibly embodying a program of machine-readable instructions executable by a digital processing apparatus to perform a method of data compression, said method comprising:
  identifying a plurality of irredundant patterns in a data set; and
  extracting at least a portion of said plurality of irredundant patterns from said data set to generate a compressed data set,
  wherein said identifying said plurality of irredundant patterns comprises identifying said plurality of irredundant patterns according to an irredundant pattern discovery algorithm, and
  wherein said irredundant pattern discovery algorithm comprises:
    initializing a set of irredundant patterns in said data set;
    constructing said set of irredundant patterns for each solid character;
    constructing location lists for said set of irredundant patterns, said set of irredundant patterns being iteratively adjusted based on said location lists until no further changes occur to said set of irredundant patterns; and
    updating said set of irredundant patterns.

17. A method for deploying computing infrastructure in which computer-readable code is integrated into a computing system, and combines with said computing system to perform a method of data compression, said method of data compression comprising:
  identifying a plurality of irredundant patterns in a data set; and
  extracting at least a portion of said plurality of irredundant patterns from said data set to generate a compressed data set,
  wherein said identifying said plurality of irredundant patterns comprises identifying said plurality of irredundant patterns according to an irredundant pattern discovery algorithm, and
  wherein said irredundant pattern discovery algorithm comprises:
    initializing a set of irredundant patterns in said data set;
    constructing said set of irredundant patterns for each solid character;
    constructing location lists for said set of irredundant patterns, said set of irredundant patterns being iteratively adjusted based on said location lists until no further changes occur to said set of irredundant patterns; and
    updating said set of irredundant patterns.

* * * * *